United States Patent
Fujii et al.

(10) Patent No.: US 10,032,510 B2
(45) Date of Patent: Jul. 24, 2018

(54) MULTIMODAL MEMRISTOR MEMORY

(71) Applicant: Hewlett Packard Enterprise Development LP, Houston, TX (US)

(72) Inventors: David B. Fujii, Boise, ID (US); Yoocharn Jeon, Palo Alto, CA (US); Siamak Tavallaei, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 85 days.

(21) Appl. No.: 15/305,309

(22) PCT Filed: Apr. 28, 2014

(86) PCT No.: PCT/US2014/035745
§ 371 (c)(1),
(2) Date: Oct. 19, 2016

(87) PCT Pub. No.: WO2015/167438
PCT Pub. Date: Nov. 5, 2015

(65) Prior Publication Data
US 2017/0040055 A1    Feb. 9, 2017

(51) Int. Cl.
*G11C 11/00* (2006.01)
*G11C 13/00* (2006.01)
*G11C 11/56* (2006.01)

(52) U.S. Cl.
CPC ............ *G11C 13/004* (2013.01); *G11C 11/56* (2013.01); *G11C 11/5685* (2013.01); *G11C 13/0002* (2013.01); *G11C 13/0007* (2013.01); *G11C 13/0069* (2013.01); *G11C 2211/5641* (2013.01)

(58) Field of Classification Search
CPC . G11C 13/0007; G11C 13/0002; G11C 11/56; G11C 11/5685; G11C 13/0069; G11C 2211/5641; G11C 13/004; G11C 13/003; G11C 2213/77; G11C 11/005; G11C 13/0026
See application file for complete search history.

(56) References Cited

U.S. PATENT DOCUMENTS

| | | | |
|---|---|---|---|
| 7,864,620 B1 | 1/2011 | Pedersen | |
| 8,050,083 B2 * | 11/2011 | Ha | G11C 13/0004 365/148 |
| 8,427,203 B2 | 4/2013 | Pino et al. | |
| 8,446,772 B2 | 5/2013 | Tu et al. | |
| 2005/0258872 A1 | 11/2005 | Snider | |
| 2007/0201274 A1 | 8/2007 | Yu et al. | |

(Continued)

OTHER PUBLICATIONS

International Searching Authority, The International Search Report and the Written Opinion, dated Jan. 15, 2015, 17 Pages.

(Continued)

*Primary Examiner* — Hien Nguyen
(74) *Attorney, Agent, or Firm* — North Shore Associates

(57) ABSTRACT

A multimodal memristor memory provides selectable or reconfigurable operation in a plurality of operational modes of a memristor. The multimodal memristor memory includes a memristor having a plurality of operational modes. The multimodal memristor memory further includes a reconfigurable interface driver to select an operational mode of the plurality of operational modes of the memristor. The memristor is to operate in the operational mode selected by the reconfigurable interface driver.

19 Claims, 4 Drawing Sheets

(56) References Cited

U.S. PATENT DOCUMENTS

| | | |
|---|---|---|
| 2008/0090337 A1 | 4/2008 | Williams |
| 2009/0213644 A1* | 8/2009 | Parkinson ............... G11C 11/56 |
| | | 365/163 |
| 2009/0213645 A1 | 8/2009 | Parkinson et al. |
| 2010/0122016 A1 | 5/2010 | Marotta et al. |
| 2013/0250651 A1 | 9/2013 | Sills |
| 2016/0343435 A1* | 11/2016 | Jeon ................... G11C 13/0002 |
| 2016/0351259 A1* | 12/2016 | Jeon ................... G06F 11/1048 |

OTHER PUBLICATIONS

Unknown, Memory Defaulting [online], Apr. 5, 2004, 10 Pgs., <http://www.securityhelpdesk.com.au/concept-install-manuals/Ref752MemV5.pdf>.

* cited by examiner

MULTIMODAL MEMRISTOR MEMORY

CROSS-REFERENCE TO RELATED APPLICATIONS

N/A

STATEMENT REGARDING FEDERALLY SPONSORED RESEARCH OR DEVELOPMENT

N/A

BACKGROUND

A memristor or 'memory resistor,' sometimes also referred to as 'resistive random access memory' (RRAM or ReRAM), is a non-linear, passive, two-terminal electrical device having or exhibiting an instantaneous resistance level that is a function of bias history. In particular, a bias (e.g., a voltage or a current) applied across terminals of the memristor may be used to set, select or program a resistance level of the memristor. Once programmed, the memristor may retain the resistance level for a specified period of time after the bias is removed (e.g., until reprogrammed). As such, a memristor is a two-terminal device that may function as a non-volatile memory where the programmed resistance level stores information.

In some examples, the memristor may be switched between a specific pair of resistance levels or 'states' using a programming signal having two different polarities (e.g., a positive voltage and a negative voltage). For example, the memristor may be switched to a first resistance state (e.g., a relatively low resistance level) by a first polarity of the programming signal. The memristor may be switched to a second resistance state (e.g., a relatively high resistance level) by a second polarity of the programming signal, for example. Such switching may be used to implement a binary memory cell or element, for example. In other examples, the memristor may be switched between a plurality of different resistance levels or states to implement a multi-state or multi-level memory cell, for example. In some examples, a plurality of memristors may be arranged in an array (e.g. a cross-bar array) to serve as a memory for storing data in a computer system or as programmable logic, according to various applications.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide a memristor memory that is reconfigurable. In particular, the memristor memory may be reconfigured in situ to provide operation in a selected one or more modes of a plurality of operational modes of the memristor memory. As such, the memristor memory is a multimodal memristor memory. Further, in situ selection of an operational mode enables a single implementation of the multimodal memristor memory to meet the requirements of a plurality of different applications. For example, a memristor memory having two operational modes may be manufactured. Following manufacture, a decision may be made (e.g., in the field) regarding an operational requirement of the memristor memory. The memristor memory may then be configured or reconfigured to meet the operational requirements by selecting an appropriate one of the plurality of operational modes that is available, for example. According to some examples, operational mode selection may be made once (e.g., static selection) after which the multimodal memristor memory operates in the selected mode. In other examples, operational mode selection may be made more than once allowing the multimodal memristor memory to be adapted to changing operational requirements, for example.

Figure 1:
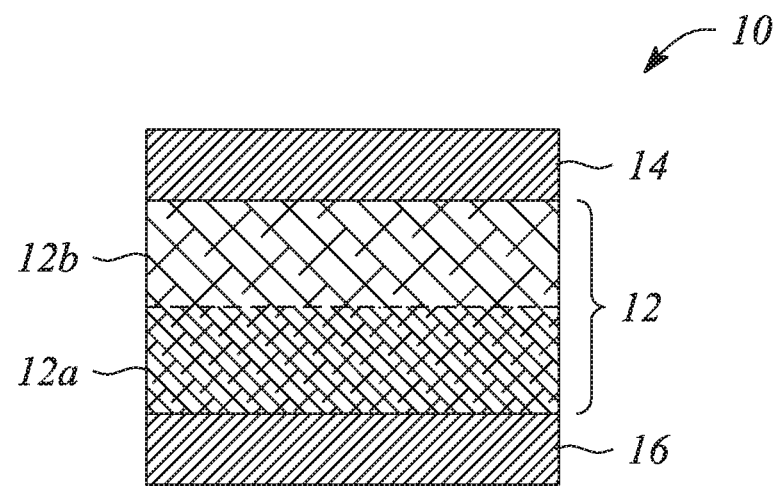
FIG. 1 illustrates a cross sectional view of a memristor, according to an example consistent with the principles described herein.

FIG. 1 illustrates a cross sectional view of a memristor 10, according to an example consistent with the principles described herein. As illustrated, the memristor 10 is a two terminal device comprising a layer 12 of a memristor switching material, also referred to as a memristor matrix or switching matrix of the memristor 10. The memristor switching material is a material that exhibits a switching phenomenon or characteristic when subjected to a stimulus (e.g., a voltage or a current), by definition herein. The memristor matrix layer 12 is disposed or 'sandwiched' between a first or 'top' electrode 14 and a second or 'bottom' electrode 16. The first and second electrodes 14, 16 facilitate applying a stimulus or 'programming signal' to affect a change in the memristor matrix layer 12. According to some examples, one or both of the first electrode 14 and the second electrode 16 may also participate in the switching phenomenon of the memristor matrix (e.g., as a donor or acceptor of a dopant).

In various examples, the memristor matrix layer 12 of the memristor 10 may include any of a variety of oxides, nitrides and even sulfides that may be formed into a layer between a pair of electrodes. For example, titanium oxide ($TiO_2$) or vanadium oxide ($VO_2$) may be used as the oxide layer in a memristor. Other oxides that may be employed include, but are not limited to, hafnium oxide, nickel oxide, nickel oxide doped with chromium, strontium titanate, chromium doped strontium titanate, tantalum oxide, niobium, and tungsten oxide, for example. Nitrides used as a nitride layer of a memristor include, but are not limited to, aluminum nitride and silicon nitride. In addition, other compounds including, but not limited to, antimony telluride, antimony germanium telluride and silver-doped amorphous silicon may be employed, for example.

In some examples, the memristor matrix layer 12 may include a crystalline oxide (e.g., an oxide layer). In other examples, the memristor matrix layer 12 may include a crystalline nitride (e.g., a nitride layer). In some of these examples, the crystalline oxide or nitride may be monocrystalline. In other examples, the memristor matrix layer 12 includes an amorphous oxide or nitride. In yet other examples, the memristor matrix layer 12 includes either a nanocrystalline oxide or a microcrystalline oxide or nitride. A nanocrystalline oxide or nitride is an oxide or nitride that includes or includes a plurality of nanoscale crystallites while a microcrystalline oxide or nitride may include crystallites having sizes in the micron range, for example.

In some examples, the memristor matrix layer 12 may include a plurality of layers. A first layer of the plurality may be a stoichiometric oxide (e.g., $TiO_2$, $VO_2$, $HfO_2$, etc.) while a second layer may be an oxygen depleted or oxygen deficient oxide layer (e.g., $TiO_{2-x}$, $VO_{2-x}$, $HfO_{2-x}$, etc.) where '2-x' denotes an oxygen deficiency, and where x is greater than 0 and less than about 2). For example, the oxygen deficient $VO_{2-x}$ may have values of x that are greater than about $10^{-5}$ and less than about $10^{-2}$. In another example, the oxygen deficient $VO_{2-x}$, may have a value of x that ranges up to about 1.0. Similarly, a first layer of the plurality of layers of the memristor matrix layer 12 may be a stoichiometric nitride (e.g., AlN, $Si_3N_4$, etc.) while a second layer may be a nitrogen depleted or nitrogen deficient nitride layer (e.g., $AlN_{1-y}$, $Si_3N_{4-y}$), etc.). In some examples, these oxygen deficient or nitrogen deficient layers may be referred to as 'suboxides' or 'subnitrides', respectively.

According to some examples, the change in the memristor matrix layer 12 produced by the programming signal may be understood in terms of oxygen (or nitrogen) migration within the memristor matrix layer 12. For example, a boundary between a layer of memristor matrix material 12b that is deficient in oxygen/nitrogen (e.g., the suboxide/subnitride layer) and another effectively stoichiometric memristor matrix material layer 12a (i.e., oxide/nitride that is not oxygen/nitride deficient) may move as a result of exposure to the programming signal. The movement of the boundary may result from oxygen or nitrogen migration under the influence of the programming signal, for example. A final location of the movable boundary may establish the 'programmed' resistance of the memristor 10, for example. Alternatively, the change in the memristor matrix layer 12 may also be understood in terms of a formation of current filaments, according to some examples. In either case, a conduction channel may be formed by the programming signal that results in a change in a resistance of the memristor matrix layer 12 as measured between the first and second electrodes 14, 16.

According to various examples, the first and second electrodes 14, 16 include a conductor. For example, the first electrode 14 and the second electrode 16 may include a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first and second electrodes 14, 16.

Additionally, the first and second electrodes 14, 16 may include more than one layer. For example, a layer of Ti may be employed between a Pt-based electrode and a $TiO_2$ based memristor matrix layer 12. The Ti layer may assist in providing an oxygen deficient layer (i.e., $TiO_{2-x}$) in the $TiO_2$ oxide memristor matrix layer 12, for example. In still other examples, materials used in the electrodes 14, 16 may act as a diffusion barrier. For example, titanium nitride (TiN) may be employed as a diffusion barrier (e.g., to prevent material diffusion between the electrodes 14, 16 and the memristor matrix 12).

In some examples, a conductive material of one or both of the first electrode 14 and the second electrode 16 may include a metallic form or constituent of a metal oxide used as the memristor matrix layer 12. For example, a Ti metal may be employed in one or both of the electrodes 14, 16 when the memristor matrix layer 12 includes $TiO_2$. Similarly, one or both of the electrodes 14, 16 may include Ta when the memristor matrix layer 12 includes $Ta_2O_5$. In yet other examples, a refractory material such as tungsten may be used in the electrode(s) 14, 16.

According to various examples, the memristor 10 provides data storage of a bit of data in the form of a plurality of resistance levels or states. In particular, the data bit may be stored in a non-volatile manner by the memristor 10 by selecting and setting or programming a particular one of at least two of the resistance levels (i.e., device or memristor states) of the plurality, according to some examples. For example, selecting and setting a first memristor state may be used to store a data bit representing a logic '1' while selecting and setting a second memristor state may be used to store a data bit representing a logic '0'.

The memristor 10 may be programmed or set by passing a current through the memristor 10, according to various examples. In particular, a particular memristor state of the at least two memristor states may be programmed or set by application of an external signal referred to herein as a 'programming' signal. The programming signal may include one or both of a voltage and a current that is applied to the memristor 10. For example, the programming signal may be an applied voltage that induces the current through the memristor 10. By definition herein, a 'bipolar' memristor is a memristor in which a polarity of the programming signal (e.g., the applied voltage and, in turn, a direction of the current induced therein) dictates which of at least two resistance levels or memristor states is selected by the programming signal. Hence, 'bipolar switching' is defined herein as switching between resistance levels of the memristor using a 'bipolar' programing signal (e.g., the applied voltage having two different polarities). For example, a first resistance level may be set by application of a programing signal having a first polarity (e.g., a positive voltage) while a second resistance level may be set by application of a programming signal having a second polarity (e.g., a negative voltage). In other examples, the memristor may be 'unipolar' memristor in which a predetermined change in the memristor state occurs regardless of or substantially independent of a polarity of a programming signal, by definition herein. In particular, the unipolar memristor has substantially no bias polarity dependence and may be driven by heating or a change in temperature, for example.

Figure 2:
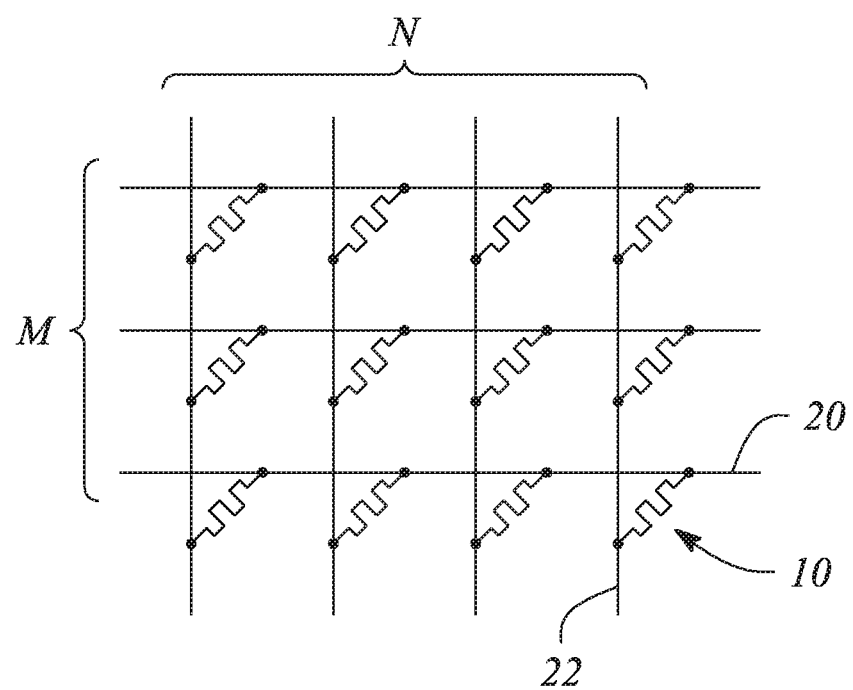
FIG. 2 illustrates a schematic diagram of a memristor-based memory circuit arranged as an M×N crossbar array, according to an example of the principles described herein.

FIG. 2 illustrates a schematic diagram of a memristor-based memory circuit arranged as an M×N crossbar array, according to an example of the principles described herein. In particular, the memristor-based memory circuit illustrated in FIG. 2 includes M rows of memristors 10 connected together with a common conductor referred to as a 'bit line' 20. Another bit line 22 connects columns of memristors 10. As such, a 1×N crossbar array would have one row (i.e., M=1) and N columns and similarly N memristors 10. Parallel bit lines 20 and parallel bit lines 22 may be implemented as parallel conductor traces, conductor 'bars' or 'wire electrodes', for example. The material of the wire electrodes may form the first and second electrodes 14, 16 of the memristors 10, for example. Further, the individual memristors 10 may be formed between the wire electrodes at cross points between the wire electrodes (i.e., cross points between bit lines 20 and bit lines 22) according to some examples.

Memristors 10 of the M×N crossbar array may be programmed by applying one or both of a voltage and a current as a programming signal to the bit lines 20, 22. A selected one of the memristors 10 at a cross point of the bit lines 20, 22 is programmed by the applied programming signal. A 'write' circuit or driver (not illustrated) may provide the programming signal, for example. Similarly, a memristor state of the selected one of the memristors 10 at the bit line cross point may be detected or 'read' by a read circuit or driver (not illustrated) connected to the bit lines 20, 22, for example.

Further, as used herein, the article 'a' is intended to have its ordinary meaning in the patent arts, namely 'one or more'. For example, 'a memristor' means one or more memristors and as such, 'the memristor' means 'the memristor(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount with a range of about 51% to about 100%, for example. Moreover, examples herein are intended to be illustrative only and are presented for discussion purposes and not by way of limitation.

Figure 3:
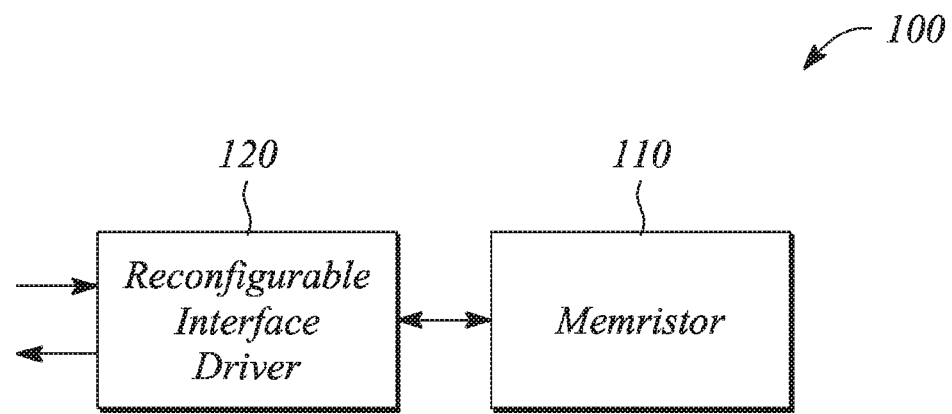
FIG. 3 illustrates a block diagram of a multimodal memristor memory, according to an example of the principles described herein.

FIG. 3 illustrates a block diagram of a multimodal memristor memory 100, according to an example of the principles described herein. The multimodal memristor memory 100 provides memristor-based memory that may operate in one or more of a plurality of operational modes. In various examples, the operational mode may be selected and then the memristor-based memory may operate in the selected operational mode. The operational mode may be selected from one or more of during manufacturing (e.g., at die packaging, prior to shipping, etc.), at boot time, at device configuration time, and during run-time.

In some examples, operational mode selection may be provided by static selection, while in other examples, the operation mode selection is dynamic. In static selection, a particular operational mode is selected once (e.g., after manufacture, at installation, at device configuration, etc.), after which the multimodal memristor memory 100 is substantially dedicated to function in or according to the selected operational mode. Dynamic operational mode selection allows the operational mode to be changed multiple times. For example, according to dynamic selection, the operational mode of the multimodal memristor memory 100 may be changed as needed to accommodate changes in an operational environment or a specific application-driven requirement associated with a use of the multimodal memristor memory 100.

The multimodal memristor memory 100 includes a memristor 110 having a plurality of operational modes. The operational modes of the plurality may include, but are not limited to, a multi-level cell (MLC) mode and a single-level cell (SLC) mode. By definition herein, the MLC mode is generally characterized by, or has, more than two different resistance levels or 'memristor states' of the memristor 110, while the SLC mode is restricted to two states, as is further described below. Further, the SLC mode may include a plurality of different SLC modes. For example, the different SLC modes may include, but are not limited to, a first SLC mode configured to provide or facilitate (e.g., maximize) along lifetime of the memristor 110 and a second SLC mode that is configured to provide or facilitate one or both of high data throughput and rapid switching between states of the memristor 110.

In particular, when configured to operate in the MLC mode, the memristor 110 may exhibit or be programmed to provide any of a plurality of predefined resistance values or levels. According to various examples, each of the predefined resistance levels corresponds to a 'state' of the memristor 110 (i.e., a 'memristor state'). The states of the memristor 110 operated in the MLC mode may be changed in situ by programming the memristor 110 during operation. For example, the memristor 110 operated in the MLC mode may be programmed to exhibit a first resistance level of the plurality of predefined resistance levels corresponding to a first memristor state. Then, at a later time, the memristor 110 may be reprogrammed to exhibit a second resistance level of the plurality that corresponds to a second memristor state. At yet a later time, the memristor 110 may again be reprogrammed to either a third resistance level representing a third memristor state or back to the first resistance level of the first memristor state.

In general, the memristor 110 operated in the MLC mode may be switched from one resistance level or memristor state to substantially any other resistance level or memristor state of the predefined plurality thereof by application of appropriate programming voltage, programming current, or equivalently 'programming signal.' Switching of the memristor 110 from a first memristor state to an arbitrary second memristor state may also include or rely on information regarding the first memristor state. In some examples, the memristor states of the MLC mode may correspond to or be used to represent and store data in the memristor 110. Further, according to some examples, the memristor state (e.g., the programmed memristor state) of the memristor 110 operated in the MLC mode may be maintained by the memristor 110 without application of power to the memristor 110. Hence, the memristor 110 operated in the MLC mode may provide substantially non-volatile storage of data.

Figure 4A:
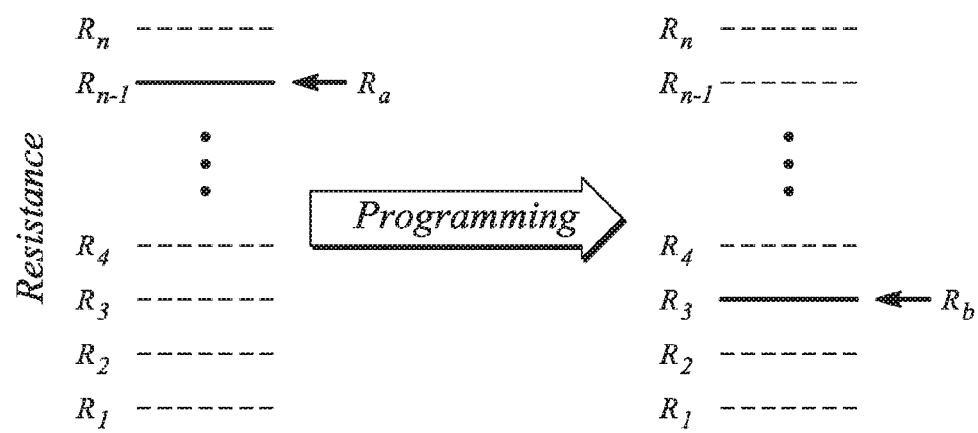
FIG. 4A illustrates a resistance diagram of a memristor configured to operate in a multi-level cell (MLC) mode, according to an example consistent with the principles described herein.

FIG. 4A illustrates a resistance diagram of a memristor 110 configured to operate in a multi-level cell (MLC) mode, according to an example consistent with the principles described herein. A left side of FIG. 4A illustrates a memristor state prior to programming, while a right side illustrates the memristor state after programming, according to an example. In particular, FIG. 4A illustrates a plurality of possible resistance levels $R_1$-$R_n$ of the memristor 110 (e.g., as measured across electrodes or terminals of the memristor 110). The possible resistance levels $R_1$-$R_n$ may correspond to a plurality of memristor states of the memristor 110 (of FIG. 3) operated in the MLC mode, for example. At the left side of the resistance diagram of FIG. 4A, an arrow points to an resistance level $R_a$ corresponding to a first memristor state prior to programming (i.e., $R_a=R_{n-1}$). After programming, the memristor state is changed to another resistance level $R_b$, as illustrated by another arrow on the right side of the resistance diagram of FIG. 4A (i.e., $R_b=R_3$). The resistance level $R_b$ may correspond to a second memristor state of the memristor 110 in FIG. 3, for example. In FIG. 4A, the pre-programming resistance level $R_a$ and the post-programming resistance level $R_b$ are illustrated using a heavy, solid line to distinguish these levels from other possible resistance levels $R_1$-$R_n$ illustrated with dashed lines.

On the other hand, the memristor 110, when operated in the SLC mode, exhibits or may be programmed to provide a selected one of two predefined resistance values or levels. As such, the memristor 110 operated in the SLC mode has only two memristor states (i.e., two 'allowed' resistance levels). The two memristor states of the SLC mode may be used to represent and store binary data. For example, a first memristor state of the two states may represent a binary '0' while a second of the two memristor states may represent a binary '1'.

According to some examples, the SLC mode may be further divided into various different SLC modes that are configured provide or promote various characteristics or features of the memristor 110. In particular, a particular SLC mode may tend to substantially extend or, in some examples, maximize a lifetime of the memristor 110, i.e., a lifetime extension SLC mode. For example, the lifetime of the memristor 110 may be extended, and in some instances substantially maximized, by employing shallow memristor states and using a relatively 'gentle' programming signal in the SLC mode. By 'gentle' it is meant that the programming signal causes a relatively slow transition between memristor states (e.g., as opposed to an abrupt transition), by definition herein. Further, 'shallow' memristor states are defined by resistance levels that are substantially away or removed from maximum and minimum resistance levels of the memristor 110. By minimizing the depth of the memristor states and by transitioning between memristor states using gentle programming signals, an amount of stress to which the memristor 110 is subjected during state switching may be minimized leading to longer memristor lifetime, according to some examples.

In other examples, another particular SLC mode may seek to substantially increase or maximize a switching speed of the memristor 110. In particular, the switching speed may be improved, and in some examples, substantially maximized, by so-called deep memristor states and through the use of relatively strong, abrupt programming signals. Herein, a 'deep' memristor state is defined as a resistance level of the memristor 110 that is at or substantially near either a maximum or a minimum resistance level or value for the memristor 110. For example, the deep memristor state corresponding to a first memristor state may be within about ten percent (10%) or about five percent (5%) or about one percent (1%) of a maximum resistance of the memristor 110. Another deep memristor state corresponding to a second memristor state of the SLC mode may be within about 10% or about 5% or about 1% of the minimum resistance of the memristor 110, for example. The 'relatively strong, abrupt' programming signal may be a relatively high-level voltage pulse, by definition herein, according to some examples.

Figure 4B:
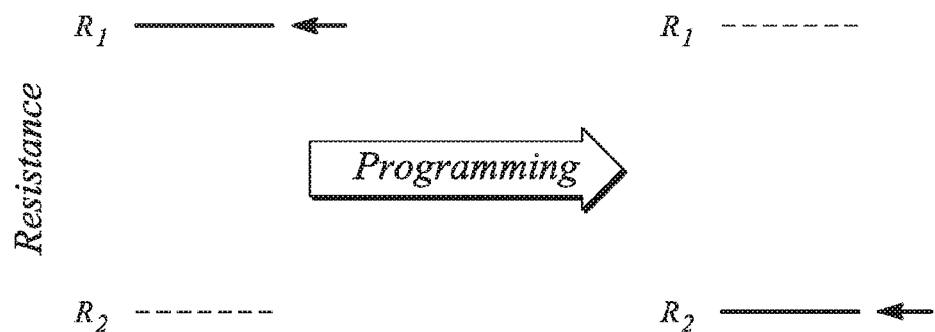
FIG. 4B illustrates a resistance diagram of a memristor configured to operate in a single level cell (SLC) mode, according to an example consistent with the principles described herein.

FIG. 4B illustrates a resistance diagram of a memristor configured to operate in a single level cell (SLC) mode, according to an example consistent with the principles described herein. A left side of FIG. 4B illustrates a memristor state prior to programming, while a right side illustrates the memristor state after programming, according to an example. In particular, FIG. 4B illustrates a pair of possible resistance levels $R_1$, $R_2$ of the memristor 110 in FIG. 3 (e.g., as measured across electrodes or terminals of the memristor 110). The two possible resistance levels $R_1$, $R_2$ may correspond to two memristor states of the memristor 110 operated in the SLC mode, for example. At the left side of the resistance diagram of FIG. 4B, an arrow points to a first resistance level $R_1$ of the pair that corresponds to a first memristor state prior to programming. After programming, the memristor state is changed to a second resistance level $R_2$ of the pair, as illustrated by another arrow on the right side of the resistance diagram of FIG. 4B. The resistance level $R_2$ may correspond to a second memristor state of two states of the memristor operated in SLC mode, for example. In FIG. 4B, the pre-programming resistance level $R_1$ and the post-programming resistance level $R_2$ are illustrated using a heavy, solid line to distinguish these levels from other possible resistance levels $R_1$, $R_2$ illustrated using dashed lines.

Referring again to FIG. 3, the multimodal memristor memory 100 further includes a reconfigurable interface driver 120. The reconfigurable interface driver 120 is configured to select an operational mode of the plurality of operational modes of the memristor 110. In particular, the reconfigurable interface driver 120 may provide a programming signal corresponding to a selected one of the operation modes of the memristor 110. Further, the reconfigurable interface driver 120 may be configured to detect and decode or 'read' a memristor state of the memristor 110 when operated according to the selected operational mode.

In some examples, the reconfigurable interface driver 120 may be configured to provide a programming signal adapted to switch the memristor 110 between memristor states of the MLC mode. By providing the MLC mode-adapted programming signal, the reconfigurable interface driver 120 explicitly selects the MLC mode as the operational mode of the memristor 110. In some examples, the reconfigurable interface driver 120 may further be configured to read (i.e., detect and decode) the memristor state in which the MLC mode-operated memristor 110 has been programmed (e.g., by the programming signal). For example, the reconfigurable interface driver 120 may be able to discriminate between specific or individual resistance levels of the plurality of resistance levels associated with the MLC mode (i.e., the predefined resistance levels).

In some examples, the reconfigurable interface driver 120 may be configured to provide a programming signal adapted to switch the memristor 110 between memristor states of the SLC mode. For example, the reconfigurable interface driver 120 may be configured to provide a first programming signal to program or 'set' the memristor 110 in a first memristor state and a second programming signal to set the memristor 110 in a second memristor state. In some examples, the reconfigurable interface driver 120 may further be configured to read (i.e., detect and decode) the two memristor states of the SLC mode operated memristor 110. For example, the reconfigurable interface driver 120 may be able to discriminate between the first and second resistance levels associated with the SLC mode.

In some examples, the reconfigurable interface driver 120 may be configured to provide a programming signal adapted to increase or extend a lifetime of the memristor 110 by selecting the shallow memristor state SLC mode. For example, the programming signal provided by the reconfigurable interface driver 120 may be the so-called gentle programming signal, described above. In this example, the reconfigurable interface driver 120 may include a pulse generator configured to provide a relatively low level voltage pulse with a gradual or sloped rise and fall profile (e.g., a gentle programming signal). In other examples, the reconfigurable interface driver 120 may be configured to provide a strong programming signal to select the deep memristor state SLC mode and also to facilitate or even to maximize switching speed of the memristor 110. Maximizing switching speed may enhance data throughput of the multimodal memristor memory 100, for example. In some examples, the reconfigurable interface driver 120 may include a pulse generator configured to provide a short, relative high-level voltage pulse as a programming signal.

In some examples, the reconfigurable interface driver 120 includes a single, reconfigurable read circuit and a single, reconfigurable write circuit to select among the operational modes of the memristor 110. In other examples, the reconfigurable interface driver 120 includes a plurality of read circuits and another plurality of write circuits. Different ones of the read circuits and the write circuits of the respective pluralities may be configured to select various ones of the memristor operational modes, for example. In particular, in some examples, each read circuit of the plurality of read circuits may correspond to a different one of the memristor operational modes. Similarly, each write circuit of the plurality of write circuits may correspond to a different one of the memristor operational modes. As such, a first pair of read and write circuits may select a first operational mode (e.g., the MLC mode or one of the SLC modes), while a second pair of the read and write circuits may select for a second operational mode, according to various examples.

In some examples in which the reconfigurable interface driver 120 includes the plurality of read and write circuits, the reconfigurable interface driver 120 further includes a mode selector to select the operational mode of the memristor 110. In particular, the mode selector is configured to select among one or both of the read circuits of the plurality of read circuits and the write circuits of the plurality of write circuits corresponding to the different memristor operational modes. The mode selector may include a switch, for example. In some examples, the mode selector may include a multiplexer (e.g., either in lieu of or in addition to the switch). Further, the mode selector may include a substantially non-volatile memory to retain a selection of the operational mode (e.g., the read/write circuit pair) in an absence of power being applied to the multimodal memristor memory 100, for example. In some examples, the non-volatile memory may include a memristor. In yet other examples, the mode selector may include one or more of a fusible link (e.g., a fuse or an antifuse) and a floating gate FET (e.g., flash memory).

Figure 5:
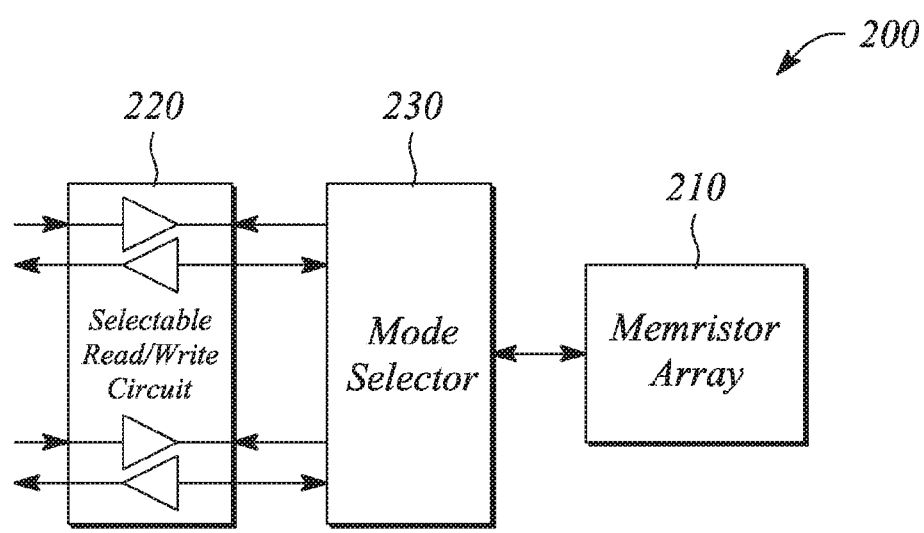
FIG. 5 illustrates a block diagram of a multimodal memristor memory system, according to an example of the principles described herein.

FIG. 5 illustrates a block diagram of a multimodal memristor memory system 200, according to an example of the principles described herein. As illustrated, the multimodal memristor memory system 200 includes a memristor array 210. The memristor array includes a plurality of memristors, according to various examples. The memristors may be arranged in a two-dimensional (2-D) array (e.g., a rectangular cross-bar array), for example. According to various examples, a memristor of the plurality has or exhibits a first operational mode and a second operational mode. In some examples, the memristor may be substantially similar to the memristor 110 described above with respect to the multimodal memristor memory 100.

In particular, in some examples, the first operational mode of the memristor of the memristor array 210 may be a multi-level cell (MLC) mode and the second operational mode may be a single level cell (SLC) mode. In another example, the first operational mode may be an SLC mode and the second operational mode may be another, different SLC mode. In yet other examples, the memristor may have or exhibit more than two operational modes including, but not limited to, the MLC mode and various SLC modes. In some examples, all of the memristors of the memristor array 210 may have or exhibit the aforementioned first and second operational modes.

As illustrated in FIG. 5, the multimodal memristor memory system 200 further includes a selectable read/write circuit 220. The selectable read/write circuit 220 is configured to selectively operate the memristor array 210 in one of the first operational mode and the second operational mode. In particular, the selectable read/write circuit 220 may provide operation of the memristor array 210 in the first operational mode, for example. Then, at another time, the selectable read/write circuit 220 may selectively provide operation of the memristor array 210 in the second operational mode.

According to some examples, the selectable read/write circuit 220 may be substantially similar to the reconfigurable interface driver 120 described above with respect to the multimodal memristor memory 100. In particular, in some examples, the selectable read/write circuit 220 may include a first read/write circuit corresponding to the first operational mode of the memristor of the memristor array 210. The selectable read/write circuit 220 may further include a second read/write circuit corresponding to the second operational mode of the memristor of the memristor array 210. In some examples, the first read/write circuit may be configured to operate the memristor of the memristor array 210 in the MLC mode and the second read/write circuit may be configured to operate the memristor of the memristor array 210 in the SLC mode.

In other examples, the first and second read/write circuits of the selectable read/write circuit 220 may be configured to operate the memristor of the memristor array 210 in various different SLC modes, respectively. For example, the selectable read/write circuit 220 may include a first SLC mode read/write circuit and a second SLC mode read/write circuit. The first SLC mode read/write circuit may be configured to provide a high data throughput SLC mode. For example, the first SLC mode read/write circuit may provide a relatively high level, short or abrupt voltage or current pulse to produce deep memristor states in the memristor of the memristor array 210. The deep memristor states, in turn, are or provide the high data throughput SLC mode, according to various examples. The second SLC mode read/write circuit may be configured to correspond to a long lifetime SLC mode of the memristor array memristor. For example, the second SLC mode read/write circuit may provide a gentle programming signal to produce shallow memristor states in the memristor of the memristor array 210, thus promoting a long lifetime of the memristor.

As illustrated in FIG. 5, the multimodal memristor memory system 200 further includes a mode selector 230. The mode selector 230 is configured to control the selectable read/write circuit 220. In particular, the mode selector 230 controls the selectable read/write circuit 220 to select between the first operational mode and the second operational mode. In some examples, the mode selector 230 may be substantially similar to the mode selector of the reconfigurable interface driver 120 described above with respect to the multimodal memristor memory 100. In particular, when the selectable read/write circuit 220 includes a first read/write circuit corresponding to the first operational mode and a second read/write circuit corresponding to the second operational mode, the mode selector 230 may include a switch. The mode selector switch may select between the first and second read/write circuits of the selectable read/write circuit 220 to provide operation of the memristor of the memristor array 210 in either of the MLC mode or the SLC mode. Similarly, the mode selector switch may select between the first and second read/write circuits configured to provide operation in or according to different SLC modes. According to some examples, the mode selector 230 may further include a non-volatile memory to retain a selection of the selectable read/write circuit and a corresponding one of the first and second operational modes in absence of power applied to the multimodal memristor memory system 200. The non-volatile memory may include a memristor, according to some examples.

Figure 6:
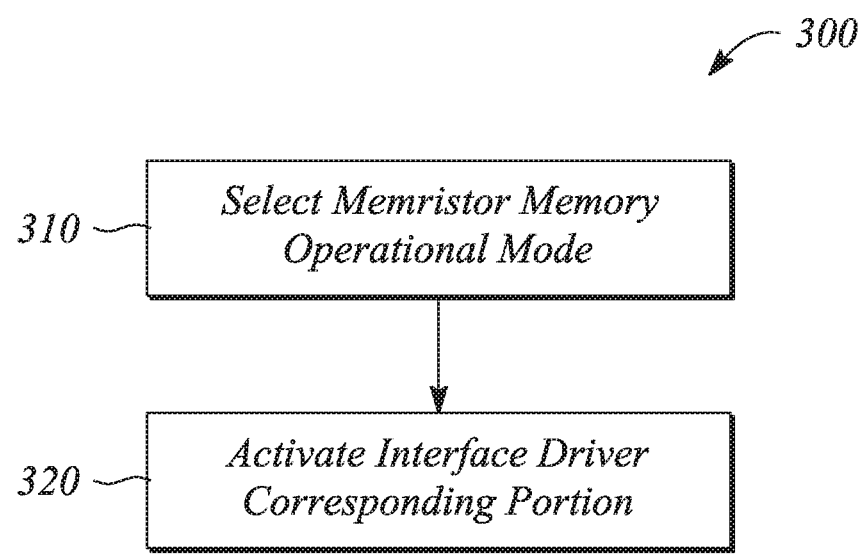
FIG. 6 illustrates a flow chart of a method of multimodal operation of a memristor memory, according to an example consistent with the principles described herein.

FIG. 6 illustrates a flow chart of a method 300 of multimodal operation of a memristor memory, according to an example consistent with the principles described herein. As illustrated in FIG. 6, the method 300 of multimodal operation includes selecting 310 an operational mode of the memristor memory. The selected operational mode is one of a plurality of operational modes of a memristor of the memristor memory. According to various examples, the selected operational mode may include, but is not limited to, a multi-level cell (MLC) mode and a single level cell (SLC) mode. The SLC mode may include one or more of an SLC mode configured to provide a high data throughput of the memristor memory (e.g., a high data throughput SLC mode) and an SLC mode configured to facilitate long lifetime operation of the memristor memory (e.g., a long lifetime SLC mode), According to some examples, the memristor memory may include a memristor substantially similar to the memristor 110 described above with respect to the multimodal memristor memory 100.

The method 300 of multimode operation further includes activating 320 a portion of an interface driver corresponding to the selected operational mode of the memristor memory. According to various examples, activating 320 a portion of the interface driver configures the interface driver to operate the memristor memory in the selected operational mode. For example, activating 320 a portion of the interface driver may select one or both of a read circuit and a write circuit configured to operate the memristor memory in the selected operational mode.

In particular, activating 320 the interface driver portion may control a switch of the interface driver, according to some examples. The interface driver may be substantially similar to the reconfigurable interface driver 120 described above with respect to the multimodal memristor memory 100. Selection 310 of the operational mode may be provided by a mode selector that is substantially similar to the mode selector 230 described above with respect to the multimodal memristor memory system 200, for example. In some examples, activating 320 a portion of the interface driver may further turn ON or apply power to the portion of the interface driver being activated 320. Other portions of the interface driver that are not being activated may be turned OFF or left unpowered, according to some examples.

Thus, there have been described examples of a multimodal memristor memory, a multimodal memristor memory system and a method of multimodal operation of a memristor memory that select between a plurality of operational modes of a memristor memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A multimodal memristor memory comprising:
a memristor having a plurality of operational modes; and
a reconfigurable interface driver to dynamically select an operational mode of the plurality of operational modes of the memristor based on run-time needs of a current application of the memory,
wherein the memristor is to operate in the operational mode selected by the reconfigurable interface driver.

2. The mutimodal memristor memory of claim 1, wherein an operational mode of the plurality is a multi-level cell (MLC) mode of the memristor, the interface drive to select from among multiple memristor states of the MLC mode.

3. The multimodal memristor memory of claim 1, wherein an operational mode of the plurality is a single-level cell (SLC) mode of the memristor.

4. The multimodal memristor memory of claim 3, wherein the reconfigurable interface driver comprises a pulse generator to generate a pulse to switch the memristor between a pair of memristor states of the SLC mode.

5. The multimodal memristor memory of claim 3, wherein the reconfigurable interface driver is to provide a shallow memristor state, the shallow memristor state to facilitate extending a lifetime of the memristor.

6. The multimodal memristor memory of claim 1, wherein the reconfigurable interface driver comprises a plurality of read circuits and another plurality of write circuits, each of the read circuits corresponding to a different one of the memristor operational modes and each of the write circuits corresponding to the different one of the memristor operational modes.

7. The multimodal memristor memory of claim 6, wherein the reconfigurable interface driver further comprises a mode selector to select among one or both of the read circuits and the write circuits to select the corresponding operational mode of the memristor.

8. The multimodal memristor memory of claim 6, wherein the selection of the operational mode by the reconfigurable interface driver is provided statically at one or more of at boot time, and at device configuration time.

9. The multimodal memristor memory of claim 5, wherein the reconfigurable interface driver is to provide a write signal with a sloped rise and fall to extend the lifetime of the memristor.

10. A multimodal memristor memory system comprising:
a memristor array comprising a plurality of memristors, a memristor of the plurality having a first operational mode and a second operational mode;
a selectable read/write circuit to selectively operate the memristor array in a selected operational mode comprising one of the first operational mode and the second operational mode; and
a mode selector to control the selectable read/write circuit and to select between the first operational mode and the second operational mode;
wherein the selectable read/write circuit comprises:
a first read/write circuit to implement the first operational mode in the memristor array; and
a second read/write circuit to implement the second operational mode in the memristor array, wherein the mode selector comprises a switch to select between the first operational mode and the second operational mode by switching to one of the first read/write circuit to implement the first operational mode or the second read/write circuit to implement the second operational mode based on which is the selected operational mode.

11. The multimodal memristor memory system of claim 10, wherein the first operational mode is a multi-level cell (MLC) mode and the second operational mode is a single level cell (SLC) mode of the memristor array.

12. The multimodal memristor memory system of claim 10, wherein both the first and second operational modes are single level cell (SLC) modes, the selectable read/write circuit comprising:
   a first SLC mode read/write circuit to provide a high data throughput SLC mode; and
   a second SLC mode read/write circuit to correspond to a lifetime extension SLC mode,
   wherein the mode selector comprises a switch to select between the first and second SLC mode read/write circuits.

13. The multimodal memristor memory system of claim 10, wherein the mode selector comprises a non-volatile memory to retain a selection of the selectable read/write circuit and a corresponding one of the first operational mode and the second operational mode in an absence of power applied to the multimodal memristor memory system.

14. The multimodal memristor memory system of claim 10, the mode selector to dynamically select an operational mode based on run-time needs of a current application of the memory.

15. A method of multimodal operation of a memristor memory, the method comprising:
   selecting an operational mode of the memristor memory, the selected operational mode being one of a plurality of operational modes of a memristor of the memristor memory; and
   activating a portion of an interface driver corresponding to the selected operational mode of the memristor memory,
   wherein activating the interface driver portion configures the interface driver to operate the memristor memory in the selected operational mode, and
   wherein the plurality of operational modes comprises a first single-level cell (SLC) mode to facilitate high data throughput of the memristor memory, and a second SLC mode to facilitate extending lifetime operation of the memristor memory.

16. The method of multimodal operation of a memristor memory of claim 15, wherein the plurality of operational modes further comprises a multi-level cell (MLC) mode of the memristor memory.

17. The method of multimodal operation of a memristor memory of claim 15, further comprising selectively operating either a first read/write circuit implementing the first SLC mode or a second read/write circuit implementing the second SLC mode.

18. The method of multimodal operation of a memristor memory of claim 15, further comprising dynamically selecting an operational mode based on run-time needs of a current application of the memristor memory.

19. The method of multimodal operation of a memristor memory of claim 15, wherein the first SLC mode utilizes a maximum resistance level within 10% of a maximum resistance value of a corresponding memristor and a minimum resistance level within 10% of a minimum resistance value of a corresponding memristor.

* * * * *